United States Patent [19]

Nishibayashi et al.

[11] Patent Number: 5,132,749
[45] Date of Patent: Jul. 21, 1992

[54] SEMICONDUCTOR DEVICE

[75] Inventors: Yoshiki Nishibayashi; Hiromu Shiomi; Maoji Fujimori, all of Hyogo, Japan

[73] Assignee: Sumitomo Electric Industries, Ltd., Osaka, Japan

[21] Appl. No.: 665,593

[22] Filed: Mar. 6, 1991

[30] Foreign Application Priority Data

Mar. 7, 1990 [JP] Japan ................... 2-55924
Jun. 8, 1990 [JP] Japan ................... 2-150340

[51] Int. Cl.$^5$ ............................. H01L 29/48
[52] U.S. Cl. ........................... 357/15; 357/60; 357/61
[58] Field of Search ............... 357/15, 60, 61; 437/175, 176, 180, 187

[56] References Cited

U.S. PATENT DOCUMENTS 4,982,243 1/1991 Nakahata et al. ............. 357/17

FOREIGN PATENT DOCUMENTS 59-208821 11/1984 Japan .
59-213126 12/1984 Japan .

OTHER PUBLICATIONS

Fujimuri et al, "Characterization of conducting diamond films", Vacum, vol. 36, No. 1-3, pp. 99-102, 1986.
Moazed et al., "Ohmic Contacts to Semiconductor Diamond", IEEE Elect Device, Letters, vol. 9, No. 7, Jul. 1988.
Shiomi et al., "Field-effect Transistors Using Boron-doped Diamond Epitaxial Films", Japanese Journal of Applied Physics, Dec. 28, 1989, No. 12, Part 2, pp. L2153-L2154.
Geis et al., "High-temperature Point-contact Transistors and Schottky Diodes Formed On Synthetic Boron-doped Diamond", IEEE Electron Device Letters, Aug. 1987, vol. EDL-8, No. 8, pp. 341-343.
Bazhenov et al., "Synthetic Diamonds In Electronics (Review)", Soviet Physics Semiconductos, Aug. 1985, vol. 19, pp. 829-841.

Primary Examiner—Georgia Y. Epps
Attorney, Agent, or Firm—Cushman, Darby & Cushman

[57] ABSTRACT

Doping a dopant into a diamond semiconductor causes lattice defects. The pn junction diode or the Schottky junction diode made from diamond has low break down voltage and high reverse leakage current owing to the lattice defects. A non-doped or low doped diamond layer with high resistivity is epitaxially grown between the N-type diamond layer and the p-type diamond layer in the pn junction diode or between the metal layer and the doped diamond layer in the Schottky diode. The intermediate layer heightens the break down voltage and decreases the reverse leakage current.

13 Claims, 2 Drawing Sheets

SEMICONDUCTOR DEVICE

FIELD OF THE INVENTION

This invention relates to a semiconductor device having at least a diamond semiconductor layer as a part of active layers; e.g. a Schottky diode, a field effect transistor or a p-n junction diode.

BACKGROUND OF THE INVENTION

The semiconductor material which is at present mostly used as the material for discrete semiconductor devices, e.g. transistors or diodes and for integrated circuits, e.g. logic devices or memory devices is silicon (Si). Besides, compound semiconductors of the groups III-V on the periodic table, e.g. gallium arsenide (GaAs) or indium phospher (InP) have been applied to special, restricted region of semiconductor devices, e.g. optoelectronic devices or super high frequency integrated circuits, because of the high electron mobility or the direct transition between the conduction band and the valence band.

Although silicon and gallium arsenide are excellent materials for semiconductor devices, these materials are not immune from the common drawback that the semiconductor devices made from these materials cannot be used at high temperature. The silicon devices cannot work above 200° C. Even the gallium arsenide devices cannot work above 300° C. This drawback is caused by the narrow band gaps between the conduction band and the valence band, e.g. 1.1 eV for silicon and 1.5 eV for gallium arsenide (1 eV = $1.602 \times 10^{-19}$ Joule). Above the temperatures (200° C. for silicon and 300° C. for gallium arsenide), the silicon or gallium arsenide semiconductor devices enter into the intrinsic region with big carrier densities.

The "carrier" means either or both electrons and holes. The "carrier density" is defined by the number of carriers in unit volume. The word "intrinsic" has a special meaning here. It is well known that semiconductors are classified into three kinds of semiconductors with regard to the electronic property; a p-type, an n-type and an intrinsic semiconductors. The p-type semiconductor has holes as majority carriers and electrons as minority carriers. The Fermi level is lower than the middle point between the bottom of the conduction band and the top of the valence band. For example, the silicon doped with boron (B) is a p-type semiconductor. The n-type semiconductor has electrons as majority carriers and holes as minority carriers. The Fermi level is higher than the middle point between the bottom of the conduction band and the top of the valence band. For example, the silicon doped with phosphor (P), arsenide (As) or antimony (Sb) is an n-type semiconductor. The intrinsic semiconductor has nearly equal number of holes and electrons, which are not called majority carriers nor minority carriers. The Fermi level coincides with the middle point between the bottom of the conduction band and the top of the valence band. In spite of the difference of electronic property, the product of the electron density and the hole density is a constant value which depends solely on temperature. Then, a person skilled in silicon semiconductor devices surely considers the intrinsic semiconductor has high resistivity because of the low carrier densities, that is, low electron density and low hole density. However, the meaning of the sentence that the silicon semiconductor enters the intrinsic region is totally different from the common sense of the person skilled. Here, the intrinsic region is used as a semiconductor which has nearly same densities of electrons and holes, but the carrier densities are very high, because the products of the densities increase according to rising of temperature. In spite of the carriers which have been supplied by an n-type dopant or a p-type dopant, thermal agitation overwhelmingly supplies many electrons and holes by exciting electrons from the valence band to the conduction band. Thus, the electron density and the hole density become almost equal in both the originally n-type semiconductor and the originally p-type semiconductor. Then, it is expressed by "entering the intrinsic region or intrinsic state". The thermal agitation easily lifts up the electrons over the band gap in silicon or gallium arsenide semiconductor devices, because of the narrow band gaps (1.1 eV for Si and 1.5 eV for GaAs). If the semiconductor devices are heated above the critical temperatures (200° C. for Si and 300° C. for GaAs), they cannot work, because a pn junction of a diode or a bipolar transistor cannot check reverse current flowing from the n-type region to the p-type region, an electric field applied at a gate of a FET (field effect transistor) cannot make depletion layer where no carrier exists. All layers of the semiconductor devices become the regions of low resistivity. Big currents flowing in the devices generate great amount of heat, which breaks down the devices in a short time.

In addition, since the degree of integration of silicon integrated circuits has been increasing year by year, the heat generation per unit volume of semiconductor devices is increasing also. The great heat generation coupled with poor heat diffusion would heat the device above the critical temperature, which may cause the disorder or breakdown of the devices. One method for resolving the heat generation in the highly integrated circuit is through the facilitation of heat diffusion or radiation using heat sinks with high heat conductivity, cooling fan or water cooling.

However, another solution of the heat problems has been proposed. The solution is fabricating semiconductor devices themselves with diamond. For example, Japanese Patent Laying Open No. 59-213126 (213126/'84) and Japanese Patent Laying Open No. 59-208821 (208821/'84) have proposed diamond semiconductor devices which would excel in heat diffusion and heat resistance. Diamond has many advantages as a semiconductor material. First, diamond is chemically very stable. Second, because of the wide band gap (5.5 eV), the temperature region in which a p-doped or an n-doped diamond is converted into an intrinsic semiconductor does not exist below 1400° C. Below this temperature, the diamond is thermally stable, since it is neither melted nor evaporated in nonoxygen atmosphere. Third, the diamond enjoys high heat diffusion, because the heat conductivity of diamond is 20 W/cm K, which is more than ten times as large as that of silicon. Fourth, diamond is gifted with high carrier mobilities. At 300K (Kelvin: absolute temperature), the electron mobility is 2000 cm$^2$/V sec, and the hole mobility is 2100 cm$^2$/V sec. High carrier mobility would bring about high frequency analog devices or high speed logic devices. Fifth, diamond has a large dielectric constant K = 5.5. Sixth, diamond is endowed with a large breakdown electric field $E_B = 5 \times 10^6$ V/cm. Therefore, it is expected that the semiconductor devices which excel in heat resistivity, work at high temperature under severe environment or generate output signals with high electric power will be fabricated by using diamond as a material of the semiconductor devices.

Preferably, the diamond as a material of semiconductor devices should be a single crystal. Today, the chemical vapor deposition method (CVD) enables us to grow a diamond single crystal epitaxially on a diamond substrate or on a silicon substrate by exciting the mixture gas consisting of methane ($CH_4$) and hydrogen ($H_2$) into plasma by microwave oscillation etc. Furthermore, an n-type diamond or a p-type diamond can arbitrarily be produced by doping pertinent dopants, such as B (p-type dopant) or P (n-type dopant) during the epitaxial growth. A non-doped diamond is an insulator with high resistivity.

However, the electric property of the diamond semiconductor layers fabricated by the CVD method heavily depends on the order of crystal. The order of crystal means the degree of the regularity of lattice in a crystal. Poor order of crystal means the state of crystal having high density of lattice defects. The poor order of crystal lowers the carrier mobilities, because the lattice defects scatter the carriers many times.

Especially, the diamond layer doped with some dopants suffers from great amount of lattice defects more heavily than the non-doped diamond layer. Therefore, when a pn junction of diamond layers or a Schottky junction of metal and diamond layers is fabricated to make a diode, a bipolar transistor or field effect transistors, many parasitic surface or interface states occur owing to the highly populated lattice defects. Here, the surface or interface state means an electronic or a hole state at the surface or the interface of the junctions where a lattice defect captures an electron or a hole at a certain energy in the band gap. In an ideal crystal without defects, the band gap defined as the region between the top of the valence band and the bottom of the conduction band has no electronic or hole state. Then the band gap is often called a forbidden band.

The surface or interface states induced by the lattice defect bring about new energy levels that electrons or holes can occupy in the band gap. The "surface or interface" means that the level is generated in the vicinity of the interface between the n-type layer and the p-type layer or between the semiconductor layer and the metal layer. It does not mean that the energy level is near the conduction band or near the valence band.

The higher the dopant concentration becomes, the larger the reverse leakage current flows from the n-type layer to the p-type layer through the intermediary of the surface or interface levels. Thus, heavy doping deteriorates the rectifying property of diode by the occurrence of surface or interface levels. Of course, the break down voltage of diode is lowered, because the leakage current generates big amount of heat which would often break the pn junction or the Schottky junction.

A purpose of the invention is to provide a diamond semiconductor device containing a pn junction or a Schottky junction with low reverse leakage current, high break down voltage and excellent rectifying property. Here, either the entire device or just the active parts of the device are made from semiconductor diamond.

SUMMARY OF THE INVENTION

The semiconductor device of this invention which contains diamond active layers comprises a pn junction or a Schottky junction and an intermediate diamond layer with high resistivity of 1 nm to 1 mm in thickness deposited between the p-type layer and the n-type layer in the case of the pn junction or deposited between the metal layer and the diamond semiconductor layer. Preferably, the intermediate diamond layer shall be 10 nm to 100 μm in thickness.

This invention can of course be applied to the semiconductors in which the entire pn junction or the Schottky junction is made from semiconductor diamond. In addition, the invention can also be applied to such semiconductors in which parts of active layers are replaced by other semiconductor materials—silicon (Si), germanium (Ge), gallium arsenide (GaAs), gallium nitride (GaN), indium phosphor (InP), zinc selenide (ZnSe), cubic boron nitride (c-BN), or silicon carbonate (SiC). The active diamond layers and the intermediate high resistivity layer can be fabricated by the chemical vapor deposition method (CVD) mentioned before.

The work of the intermediate diamond layer characterizing this invention will be now explained. As mentioned before, doping dopants into the CVD grown diamond deteriorates the rectifying property or the break down voltage of the pn junction or the Schottky junction by introducing many lattice defects into the crystal structure of diamond. Namely, the rectifying property or the break down voltage severely depends on the order of crystal near the interface of the junctions.

If the order of crystal is good enough in the vicinity of the interface, no surface states would be generated. Then such a diamond device without surface states could accomplish a good rectifying property and a high break down voltage of diode.

Since doping introduces the disorder of crystal in diamond, a non-doped or low-doped diamond must be gifted with good order of crystal in comparison with the highly doped semiconductor diamond. It is assumed that the reason why a diamond crystal structure is so heavily disturbed by doping is because the C—C bond in diamond structure is too tough to replace one of carbon atoms by other element and the replaced bond C-X (X is not a carbon atom) cannot easily reconstruct the diamond structure in succession.

To avoid the doping-induced disorder of crystal, the semiconductor devices of this invention has a non-doped or low doped intermediate layer with high resistivity between the n-type layer and the p-type layer of the pn junction or between the metal layer and the doped diamond (p-type or n-type) layer of the Schottky junction. The newly introduced intermediate layer is immune from the disorder of lattice structure, or lattice defects. There is little surface states in the intermediate layer because of the perfect lattice structure. Thus, the intermediate layer prevents the carriers from flowing by hopping on the surface states in the reverse direction. Thus, the reverse leakage current is decreased by the intermediate layer.

Although the intermediate layer contributes to decreasing the leakage current and raising the break down voltage by forbidding the hopping conduction through the random surface states, the intermediate layer also decreases the forward current because of the high resistivity. To avoid decreasing the forward current to a big extent, the resistance should be determined in an optimum range. If the resistivity is high, the thickness shall be small or if the resistivity is low, the thickness may be big.

However, the intermediate layer is not equivalent to a resistor connected in series to the diode. If a resistor was connected in series to the diode, the resistor would heighten the series resistances both for the forward current and for the reverse current. Since the original resistance for the reverse current is high, the inserted resistor would have little influence on the reverse current. However, the forward current would be greatly influenced, because the original resistance is small. Then such resistor would only deteriorate the rectifying property of diode. On the contrary, the intermediate layer of the invention decreases the reverse current by an amount greater than that determined by the resistance. It is, of course, partly because the intermediate layer suppresses the hopping conduction of carriers on the interface states as mentioned before. However, the intermediate layer of the invention can decrease the reverse leakage current so drastically that the two grounds mentioned, that is, the high conductivity and the suppression of hopping conduction, seem to be insufficient. Perhaps there may be another ground for decreasing the reverse current by the intermediate layer.

The third ground is not clearly understood. But it is supposed that the perfect lattice structure of the intermediate layer may improve the order of lattice structures of the p-type and n-type layers in contact with it. Then, the intermediate layer may reduce the occurrence of lattice defects in the doped (p or n) layers. This may be called "forced annealing effect", because the doped layers are by force annealed or reformed at high temperature by the intermediate layer. Perhaps, this may be the most important principle on which this invention is based. The p-type or n-type layer is epitaxially grown on the intermediate layer with a nearly perfect single crystal structure. Since the substrate is kept at high temperature during the epitaxial growth, carbon atoms and dopant atoms are easily moved by weak forces, because thermal agitation energy $3kT/2$, where k is the Boltzmann constant and T is the absolute temperature, overwhelms the binding energy of the chemical bonds. The carbon atoms and dopant atoms are actively moving for decreasing the free energy in the p-type layer or the n-type layer. Since the doped layers are in contact with the intermediate layer with a perfect diamond lattice structure, the state with minimum free energy of the doped layers is also the state having a perfect diamond lattice structure. Then, the resettlement of carbon atoms and dopant atoms occurs toward restoring a perfect diamond lattice structure in the doped layers. The intermediate layer plays a role of a seed crystal for recrystallization of the doped layers deposited on both sides or one side. This is comparable with the seed crystal in the Czochralski method or Bridgman method for growing a bulk single crystal. For example, the Czochralski method comprises the steps of melting material into a melt in a crucible, dipping a rotating seed crystal into the melt and pulling the seed crystal. Then, a crystal grows in succession to the seed crystal. The crystal will imitate the seed crystal. Namely, the crystal pulled up is a single crystal whose crystallographical direction is the same as that of the seed crystal.

While the Czochralski method or Bridgman is a method for growing a big crystal from liquid phase, the epitaxy is a method for growing a small thin film crystal from vapor phase. They are totally different categories for crystal growth. But the intermediate layer of the epitaxy of the invention corresponds to the seed crystal of the Czochralski or Bridgman method.

Of course, in the case of homoepitaxy, the substrate plays a role similar to the seed crystal, since the substrate determines the crystallographical direction of the epitaxial layer. In addition to the substrate, the intermediate layer also determines the crystallographical direction and reforms the lattice structure of the neighboring epitaxial layers.

The thickness of the intermediate layer of the device is 1 nm to 1 mm. If the intermediate layer is thinner than 1 nm, the carriers easily penetrate the intermediate layer. Then the thin intermediate layer cannot prevent reverse leakage current. On the contrary, if the intermediate layer is thicker than 1 mm, which is longer than the diffusion length of carriers in diamond, no current flows through the thick intermediate layer from the p-type layer to the n-type layer, when a forward bias voltage is applied on the junctions. Preferably, the thickness of the intermediate layer should be 10 nm to 100 $\mu$m.

It is desirable that the resistivity of the intermediate layer is higher than $10^2$ $\Omega$ cm. The diamond layer with a resistivity lower than $10^2$ $\Omega$ cm includes high density of lattice defects which cause the surface states for carriers. Any intermediate layers with a resistivity higher than $10^2$ $\Omega$ cm can be used as an intermediate layer. However, the thickness must be small, if the resistivity is high, since the resistance of the intermediate layer must be small enough for the forward current to flow through the layer. The maximum resistivity of the non-doped diamond layer grown by the CVD method is $10^{12}$ $\Omega$ cm. Then, the desirable resistivity of the intermediate layer of the invention is $10^2$ $\Omega$ cm to $10^{12}$ $\Omega$ cm.

BRIEF DESCRIPTIONS OF THE DRAWINGS

DETAILED DESCRIPTION OF THE PREFERRED EMBODIMENTS

EMBODIMENT 1

Figure 1A:
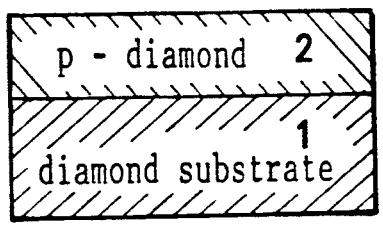
FIG. 1(a) is a sectional view of the diamond semiconductor device of the embodiment 1 at the first step of fabrication.
Figure 1B:
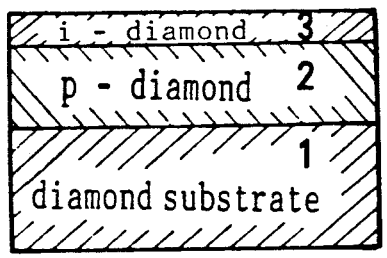
FIG. 1(b) is a sectional view of the diamond semiconductor device of the embodiment 1 at the second step of fabrication.
Figure 1C:
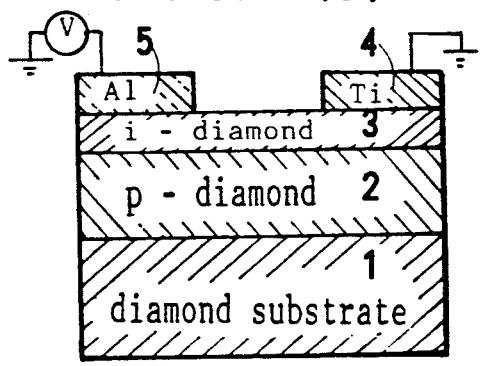
FIG. 1(c) is a sectional view of the diamond semiconductor device of the embodiment 1 at the third step of fabrication.

A Schottky diode is fabricated on a diamond single crystal substrate (1) which has been synthesized by the ultra high pressure method. The size of the substrate is 2 mm $\times$ 1.5 mm $\times$ 0.3 mm. The surface of the substrate is a (100) plane or a plane slightly slanting to the (100) plane by an angle less than five degrees. FIG. 1(a) to (c) show the sectional views of the device at three steps of fabrication.

(1) First, a p-type diamond layer (2) of 1 μm in thickness is epitaxially grown on the diamond substrate (1) by the microwave plasma CVD method. The conditions of the CVD growth are;

material gas: $H_2$, $CH_4$
   p-type dopant gas: $B_2H_6$
   volume ratio of methane to $H_2$: $CH_4/H_2 = 6/100$
   volume ratio of $B_2H_6$ to $CH_4$: $B_2H_6/CH_4 = 100$ ppm
   microwave oscillation power: 300 W
   pressure of gas: 40 Torr
   thickness of the p-type layer: 1 μm FIG. 1(a) shows the substrate (1) deposited with the p-type layer (2).

(2) Second, a non-doped, high resistivity, intermediate diamond layer (3) of 0.1 μm in thickness is epitaxially grown on the p-type layer (2) by the microwave plasma CVD method. In this case, no dopant gas is used. The conditions of the CVD growth are;

material gas: $H_2$, $CH_4$
   volume ratio of methane to $H_2$: $CH_4/H_2 = 6/100$
   microwave oscillation power: 300 W
   pressure of gas: 40 Torr
   thickness of the non-doped layer: 0.1 μm FIG. 1(b) shows the substrate (1) deposited with the p-type layer (2) and the high resistivity layer (3). The resistivity of the layer (3) is more than $10^4$ Ω cm.

(3) Third, a titanium electrode (4) is mounted on the high resistivity, intermediate layer (3) as an ohmic electrode by evaporation coating. The "ohmic" electrode means an electrode which forms an ohmic contact with the semiconductor layer. The ohmic contact is defined as a contact which follows the ohmic law; the current is in proportion to the voltage and the proportion constants (conductivity) of the forward direction and the backward direction are equal.

(4) Fourth, an aluminum electrode (5) is mounted on the high resistivity, intermediate layer (3) as a Schottky electrode by evaporation coating. The "Schottky" electrode means an electrode which forms a Schottky junction with the semiconductor layer. The Schottky junction between the metal and the semiconductor is defined as a rectifying junction, through which a current flows in a direction (forward) but no current flows in the reverse direction (reverse current). FIG. 1(c) shows the device with the electrodes (4) and (5).

This is a Schottky diode of the embodiment 1.

Figure 2:
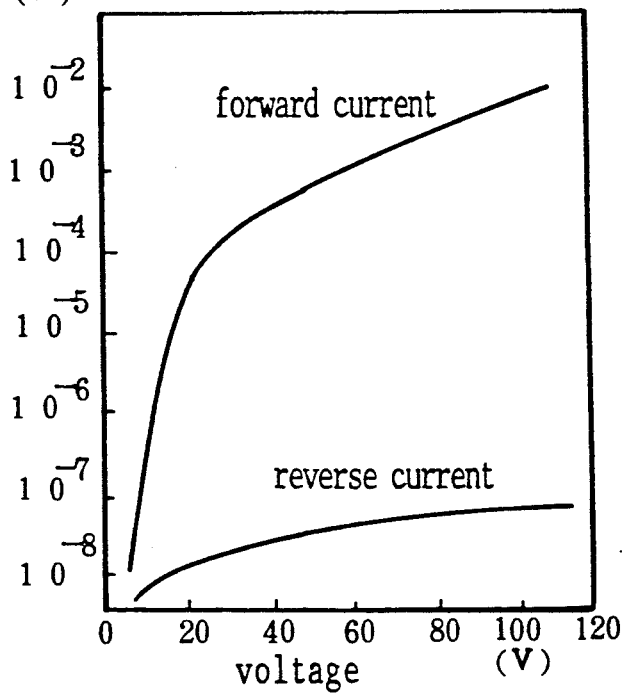
FIG. 2 is a graph of the voltage-current relation of the Schottky diode of the embodiment 1.

To investigate the rectifying property of the Schottky diode, forward voltage or reverse voltages is applied on the Schottky aluminum electrode (4), while the ohmic titanium electrode (5) is connected to the ground level. The forward current which flows from the titanium electrode (4) to the aluminum electrode (5) is measured, when the forward voltage is applied. The upper curve in FIG. 2 shows the forward voltage-current relation. The abscissa is the voltage (V) applied. The ordinate is the current (A). The reverse leakage current which flows from the aluminum electrode to the titanium electrode is also measured, when the reverse voltage is applied. The lower curve in FIG. 2 shows the reverse voltage-current relation. Although the reverse voltage and the reverse current are minus quantities, the relation is here depicted together with the forward relation in FIG. 1 for simplicity. The reverse current is small enough. The rectifying ratio of the forward current to the reverse current at the same voltage is about $10^4$ to $10^5$ in the Schottky diode of the embodiment 1. The break down voltage is more than 120 V. This is a good diode.

To investigate the influence of the resistivity of the intermediate layer upon the rectifying property, another Schottky diode in which the non-doped intermediate layer (3) is replaced by a low B-doped intermediate layer (3) with the resistivity $10^3$ Ω cm is also fabricated. The rectifying ratio of the diode is $10^4$. This is also a good diode. This result ensures the effectiveness of the lower limit $10^2$ Ω cm of the resistivity of the intermediate layer (3).

Figure 3:
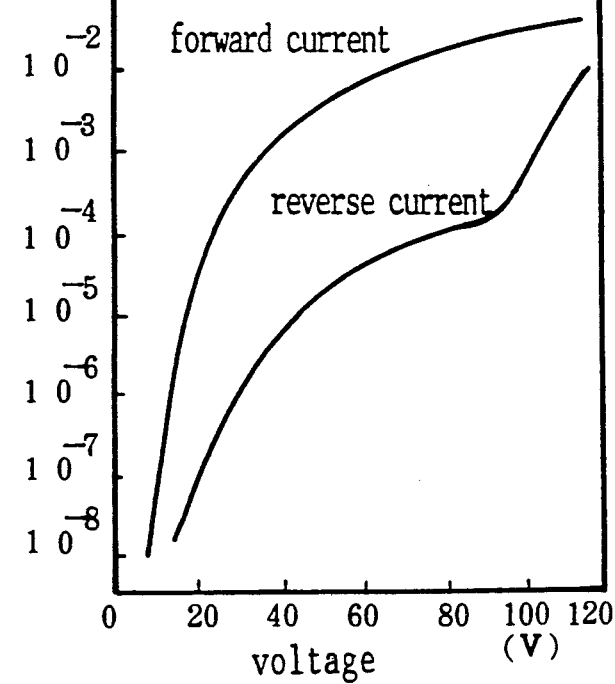
FIG. 3 is a graph of the voltage-current relation of the Schottky diode without the intermediate layer.

To estimate the influence of the intermediate, high resistivity layer (3), another Schottky diode without the intermediate layer (3) is also fabricated. A titanium electrode (4) and an aluminum electrode (5) are mounted on the p-type layer (2) in the diode. FIG. 3 shows the forward voltage-current relation and the reverse voltage-current relation. The rectifying ratio of the forward current to the reverse-current is $10^2$ to $10^3$. With regard to the break down voltage, a breakdown occurs between 80 V and 90 V of the reverse voltage.

A Schottky diode can also be fabricated on a synthesized diamond single crystal substrate by depositing a n-type diamond layer on the diamond substrate. Then a non-doped, high resistivity, intermediate diamond substrate is deposited on the n-type diamond layer. Finally, a titanium electrode and an aluminum electrode is mounted on the intermediate diamond layer. This forms a Schottky diode which is reciprocal in regard to the conduction of the pn device described above.

EMBODIMENT 2

A pn junction diode is fabricated on a synthesized diamond single crystal (2 mm × 1.5 mm × 0.3 mm). The processes of fabrication are the same as in embodiment 1 in order to form the structure shown by FIG. 1(b). Namely a B-doped, P-type layer (2) and the high resistivity layer (3) have been deposited on the substrate (1) by the microwave plasma CVD method under the same conditions.

Figure 4A:
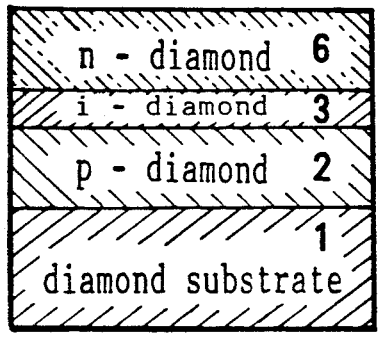
FIG. 4(a) is a sectional view of the diamond device of the embodiment 2 at the first step of fabrication.

(1) In the embodiment 2, an n-type diamond layer (6) with the thickness of 1 μm is further grown on the high resistivity layer (3) by the microwave plasma CVD method. The conditions are;

material gas: $H_2$, $CH_4$
   n-type dopant gas: $PH_3$
   volume ratio of methane to $H_2$: $CH_4/H_2 = 6/100$
   volume ratio of $PH_3$ to $CH_4$: $PH_3/CH_4 = 200$ ppm
   microwave oscillation power: 300 W
   pressure of gas: 40 Torr
   thickness of the n-type layer: 1 μm FIG. 4(a) shows the diamond layers after this process.

(2) Half of the surface of the n-type diamond layer (6) is covered with an aluminum mask (7) deposited by evaporation coating.

(3) Uncovered halves of the n-type layer (6) and the intermediate layer (3) are etched away by the reactive ion etching method (RIE) using oxygen plasma.

Figure 4B:
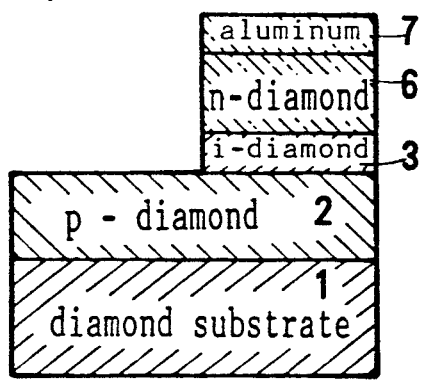
FIG. 4(b) is a sectional view of the diamond device of the embodiment 2 at the second step of fabrication.

FIG. 4(b) shows the diamond layers after the RIE process.

(4) The aluminum mask (7) is gotten rid of by the wet etching.

Figure 4C:
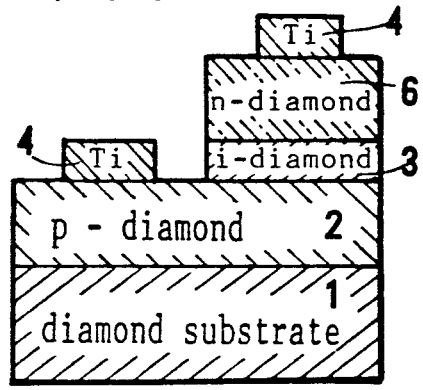
FIG. 4(c) is a sectional view of the diamond device of the embodiment 2 at the third step of fabrication.

(5) Ohmic titanium electrodes (4) are deposited on the p-type layer (2) and the n-type layer (6). A pn junction diode (FIG. 4(c)) is accomplished. The forward voltage-current relation and the reverse voltage-current relation are measured. The diode shows a good rectifying property. The rectifying ratio of the forward current to the reverse current at 100 V is $10^5$.

A pn junction diode can also be fabricated on a synthesized diamond single crystal by depositing a n-type diamond layer on the diamond substrate. An intermediate diamond substrate is deposited on the n-type diamond layer. After a p-type substrate is deposited on the intermediate diamond substrate, the ohmic titanium electrodes are deposited on the n-type layer and p-type layer. This forms a device which is reciprocal in regard to the conduction of the pn junction described above.

EMBODIMENT 3

A diamond Schottky diode is fabricated on a p-type silicon substrate (11). The size of the p-type silicon substrate (11) is 5 mm×5 mm×0.3 mm. The resistivity of the substrate (11) is $10^{-2}$ Ωcm.

(1) First, a p-type diamond layer (12) with the thickness of 1 μm is epitaxially grown on the p-type silicon substrate (11) by the microwave plasma CVD method. This is not homoepitaxy but heteroepitaxy. The conditions of the heteroepitaxy are;
material gas: $H_2$, $CH_4$
p-type dopant gas: $B_2H_6$
volume ratio of methane to $H_2$: $CH_4/H_2 = 1/100$
volume ratio of $B_2H_6$ to $CH_4$: $B_2H_6/CH_4 = 100$ ppm
microwave oscillation power: 300 W
pressure of gas: 40 Torr
thickness of the p-type diamond layer: 1 μm (2) Second, a high resistivity, intermediate diamond layer (13) with the thickness of 0.1 μm is epitaxially grown on the p-type diamond layer (13) by the microwave plasma CVD method without dopant gas under the conditions;
material gas: $H_2$, $CH_4$
volume ratio of methane to $H_2$: $CH_4/H_2 = 1/100$
microwave oscillation power: 300 W
pressure of gas: 40 Torr
thickness of the high resistivity layer: 0.1 μm
The resistivity of the intermediate layer (13) is more than $10^4$ Ωcm.

(3) A tungsten electrode (15) is deposited on the intermediate diamond layer (13) as a Schottky electrode by the sputtering.

(4) A titanium electrode (14) is deposited on the silicon substrate (11) as an ohmic electrode by the electron beam evaporation coating.

Figure 5:
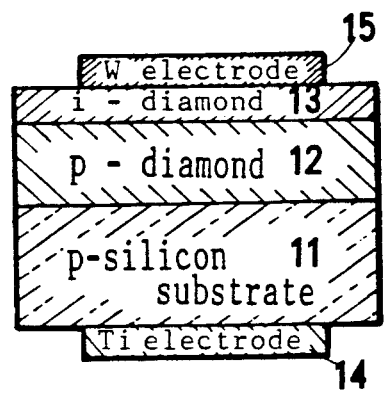
FIG. 5 is a sectional view of the diamond device of the embodiment 3.

A Schottky diode as shown in FIG. 5 is obtained. The forward current flows from the titanium electrode (14) to the tungsten electrode (15). Since the current flow is vertical to the substrate (11) and the layers (12) and (13), the forward resistance is small. The maximum alternate current the diode can rectify is 5 A (the voltage applied is 200 V).

EMBODIMENT 4

Figure 6:
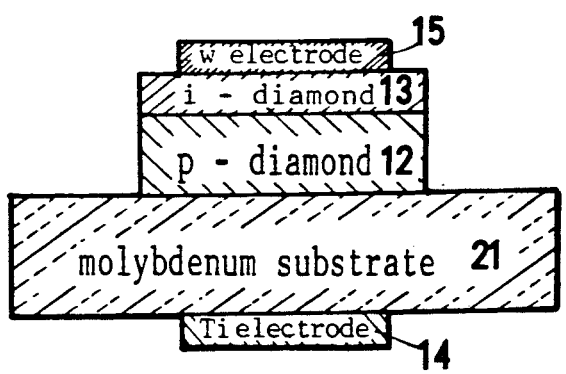
FIG. 6 is a sectional view of the diamond device of the embodiment 4.

A diamond Schottky diode (FIG. 6) is fabricated on a molybdenum substrate (21) with high heat conductivity instead of the silicon substrate in the embodiment 3. The size of the molybdenum substrate (21) is 20 mm×20 mm×0.2 mm. Although the substrate (21) is wider than the silicon substrate of the embodiment 3, most of the substrate (21) is masked except for a square region (5 mm×5 mm) at the center. The area of the unmasked region is equal to that of the substrate of the embodiment 3.

A p-type diamond layer (12) and a high resistivity, intermediate diamond layer (13) are epitaxially grown on the unmasked region of the substrate by the microwave plasma CVD method under the conditions same as the embodiment 3. A tungsten electrode (15) is deposited on the intermediate layer (13) by the sputtering as a Schottky electrode. A titanium electrode (14) is deposited on the molybdenum substrate (21) by the electron beam evaporation coating as an ohmic electrode.

Because the wide molybdenum substrate (21) works as an effective radiator, the Schottky diode can rectify a big current. The maximum alternate current that this diode can rectify is 10 A (the voltage applied is 200 V)

EMBODIMENT 5

A diamond Schottky diode having a thick intermediate layer is fabricated on a diamond substrate. The substrate is a diamond single crystal synthesized by the ultra high pressure method. The size is 2 mm×1.5 mm×0.3 mm like the embodiment 1. The surface is a (100) plane or a plane which is slanting to the (100) plane within 5 degrees.

(1) A $p^+$-type diamond layer with the thickness of 100 μm is epitaxially grown on the substrate by the microwave plasma CVD method under the conditions;
material gas: $H_2$, $CH_4$
p-type dopant gas: $B_2H_6$
volume ratio of methane to $H_2$: $CH_4/H_2 = 6/100$
volume ratio of $B_2H_6$ to $CH_4$: $B_2H_6/CH_4 = 1000/6$ ppm
microwave oscillation power: 300 W
pressure of gas: 40 Torr
thickness of the $p^+$-type diamond layer: 100 μm
The symbol "$p^+$" means that doping amount of the p-type dopant is larger than the p-type region, although there is no absolute boundary between the "p" and "$p^+$". The boron concentration in the $p^+$-type layer is $3 \times 10^{20}$ cm$^{-3}$.

(2) A non-doped intermediate layer of 800 μm in thickness is epitaxially grown as a high resistivity layer on the $p^+$-type diamond layer by the microwave plasma CVD method under the conditions;
material gas: $H_2$, $CH_4$
volume ratio of methane to $H_2$: $CH_4/H_2 = 6/100$
microwave oscillation power: 300 W
pressure of gas: 40 Torr
thickness of the diamond layer: 800 μm (3) A titanium electrode is deposited on the intermediate layer as an ohmic electrode by the electron beam evaporation coating.

(4) An aluminum electrode is deposited on the intermediate layer as a Schottky electrode by the evaporation coating.

The Schottky diode has a very thick intermediate layer (800 μm) and a thick $p^+$ layer (100 μm). While the titanium electrode is connected to the ground, forward voltage or reverse voltage is applied to the aluminum electrode. The forward current and the reverse current are measured. In spite of the thickness of the non-doped layer (800 μm), the forward current does flow. The rectifying ratio of the forward current to the reverse current is $10^4$ to $10^5$ at the bias voltage of 100 V. The break down voltage is 50 kV.

What we claim is;

1. A semiconductor device comprising:
   an n-type diamond layer,
   a non-doped or low doped intermediate diamond layer with high resistivity between $10^2$ $\Omega$cm and $10^{13}$ $\Omega$cm deposited on the n-type diamond layer, the intermediate layer being 1 nm to 1 mm in thickness,
   a p-type diamond layer deposited on the intermediate diamond layer,
   an ohmic electrode deposited on the n-type diamond layer, and
   an ohmic electrode deposited on the p-type diamond layer.

2. A semiconductor device as claimed in claim 1, wherein the thickness of the intermediate diamond layer is 10 nm to 100 $\mu$m.

3. A semiconductor device comprising:
   a diamond single crystal substrate,
   a p-type diamond layer being epitaxially grown on the diamond substrate,
   a non-doped or low doped intermediate diamond layer with high resistivity between $10^2$ $\Omega$cm and $10^{12}$ $\Omega$cm being epitaxially grown on the p-type diamond layer, the intermediate layer being 1 nm to 1 mm in thickness,
   an n-type diamond layer being epitaxially grown on the intermediate layer,
   an ohmic electrode deposited on the p-type diamond layer, and
   an ohmic electrode deposited on the n-type diamond layer.

4. A semiconductor device comprising:
   a diamond single crystal substrate,
   an n-type diamond layer being epitaxially grown on the diamond substrate,
   a non-doped or low doped intermediate diamond layer with high resistivity between $10^2$ $\Omega$cm and $10^{12}$ $\Omega$cm being epitaxially grown on the n-type diamond layer, the intermediate layer being 1 nm to 1 mm in thickness,
   a p-type diamond layer being epitaxially grown on the intermediate layer,
   an ohmic electrode deposited on the n-type diamond layer, and
   an ohmic electrode deposited on the p-type diamond layer.

5. A semiconductor device comprising:
   a p-type diamond layer,
   a non-doped or low doped intermediate diamond layer with high resistivity between $10^2$ $\Omega$cm and $10^{12}$ $\Omega$cm deposited on the p-type diamond layer, the intermediate layer being 1 nm to 1 mm in thickness,
   a Schottky electrode formed on the intermediate diamond layer, and
   an ohmic electrode formed on the intermediate diamond layer.

6. A semiconductor device comprising:
   a n-type diamond layer,
   a non-doped or low doped intermediate diamond layer with high resistivity between $10^2$ $\Omega$cm and $10^{12}$ $\Omega$cm deposited on the n-type diamond layer, the intermediate layer being 1 nm to 1 mm in thickness,
   a Schottky electrode formed on the intermediate diamond layer, and
   an ohmic electrode formed on the intermediate diamond layer.

7. A semiconductor device as claimed in claim 5 or 6, wherein the thickness of the intermediate diamond layer is 10 nm to 100 $\mu$m.

8. A semiconductor device comprising:
   a diamond single crystal substrate,
   a p-type diamond layer being epitaxially grown on the diamond substrate,
   a non-doped or low doped intermediate diamond layer with high resistivity between $10^2$ $\Omega$cm and $10^{12}$ $\Omega$cm being epitaxially grown on the p-type diamond layer, the intermediate layer being 1 nm to 1 mm in thickness,
   a Schottky electrode deposited on the intermediate diamond layer, and
   an ohmic electrode deposited on the intermediate diamond layer.

9. A semiconductor device comprising:
   a diamond single crystal substrate,
   a p-type diamond layer being epitaxially grown on the diamond substrate,
   a non-doped or low doped intermediate diamond layer with high resistivity between $10^2$ $\Omega$cm and $10^{12}$ $\Omega$cm being epitaxially grown on the p-type diamond layer, the intermediate layer being 1 nm to 1 mm in thickness,
   an aluminum electrode deposited on the intermediate diamond layer as a Schottky electrode, and
   a titanium electrode deposited on the intermediate diamond layer as an ohmic electrode.

10. A semiconductor device comprising:
    a diamond single crystal substrate,
    an n-type diamond layer being epitaxially grown on the diamond substrate,
    a non-doped or low doped intermediate diamond layer with high resistivity between $10^2$ $\Omega$cm and $10^{12}$ $\Omega$cm being epitaxially grown on the n-type diamond layer, the intermediate layer being 1 nm to 1 mm in thickness,
    a Schottky electrode deposited on the intermediate diamond layer, and
    an ohmic electrode deposited on the intermediate diamond layer.

11. A semiconductor device as claimed in claim 8 or 9, wherein the thickness of the intermediate diamond layer is 10 nm to 100 $\mu$m.

12. A semiconductor device comprising:
    a p-type silicon single crystal substrate,
    a p-type diamond layer being epitaxially grown on the p-type silicon substrate,
    a non-doped or low doped intermediate diamond layer with high resistivity between $10^2$ $\Omega$cm and $10^{12}$ $\Omega$cm being epitaxially grown on the p-type diamond layer, the intermediate layer being 1 nm to 1 mm in thickness,
    a Schottky electrode deposited on the intermediate diamond layer, and
    an ohmic electrode deposited on the p-type silicon substrate.

13. A semiconductor device comprising:
    a molybdenum substrate,
    a p-type diamond layer being grown on the molybdenum substrate,
    a non-doped or low doped intermediate diamond layer with high resistivity between $10^2$ $\Omega$cm and $10^{12}$ $\Omega$cm being epitaxially grown on the p-type diamond layer, the intermediate layer being 1 nm to 1 mm in thickness,
    a Schottky electrode deposited on the intermediate diamond layer, and
    an ohmic electrode deposited on the molybdenum substrate.

* * * * *